(12) United States Patent
Kitai et al.

(10) Patent No.: US 10,240,015 B2
(45) Date of Patent: Mar. 26, 2019

(54) MODIFIED POLYPHENYLENE ETHER, METHOD FOR PREPARING SAME, POLYPHENYLENE ETHER RESIN COMPOSITION, RESIN VARNISH, PREPREG, METAL-CLAD LAMINATE AND PRINTED CIRCUIT BOARD

(71) Applicant: PANASONIC INTELLECTUAL PROPERTY MANAGEMENT CO., LTD., Osaka (JP)

(72) Inventors: Yuki Kitai, Osaka (JP); Hiroaki Fujiwara, Fukushima (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 983 days.

(21) Appl. No.: 14/414,992

(22) PCT Filed: Aug. 27, 2013

(86) PCT No.: PCT/JP2013/005060
§ 371 (c)(1),
(2) Date: Jan. 15, 2015

(87) PCT Pub. No.: WO2014/034103
PCT Pub. Date: Mar. 6, 2014

(65) Prior Publication Data
US 2015/0218326 A1 Aug. 6, 2015

(30) Foreign Application Priority Data

Aug. 29, 2012 (JP) .................. 2012-188336
Aug. 29, 2012 (JP) .................. 2012-188337

(51) Int. Cl.
| | |
|---|---|
| C08J 5/24 | (2006.01) |
| C08L 71/12 | (2006.01) |
| C08G 65/48 | (2006.01) |
| H05K 1/03 | (2006.01) |
| B32B 5/02 | (2006.01) |
| B32B 15/14 | (2006.01) |
| B32B 15/20 | (2006.01) |
| C09D 171/12 | (2006.01) |
| C08K 5/29 | (2006.01) |

(52) U.S. Cl.
CPC ............... *C08J 5/24* (2013.01); *B32B 5/022* (2013.01); *B32B 15/14* (2013.01); *B32B 15/20* (2013.01); *C08G 65/48* (2013.01); *C08G 65/485* (2013.01); *C08K 5/29* (2013.01); *C08L 71/12* (2013.01); *C08L 71/126* (2013.01); *C09D 171/12* (2013.01); *H05K 1/0326* (2013.01); *H05K 1/0366* (2013.01); *B32B 2260/021* (2013.01); *B32B 2260/046* (2013.01); *B32B 2262/0269* (2013.01); *B32B 2262/0276* (2013.01); *B32B 2262/101* (2013.01); *B32B 2307/204* (2013.01); *B32B 2307/306* (2013.01); *B32B 2457/08* (2013.01); *C08J 2371/12* (2013.01); *H05K 2201/0278* (2013.01); *H05K 2201/0284* (2013.01); *H05K 2201/0293* (2013.01); *Y10T 428/24917* (2015.01); *Y10T 428/249921* (2015.04); *Y10T 442/20* (2015.04); *Y10T 442/656* (2015.04)

(58) Field of Classification Search
CPC .. C08F 283/08; C08F 283/085; C08G 65/485; C08L 71/126
See application file for complete search history.

(56) References Cited

U.S. PATENT DOCUMENTS

| | | | | |
|---|---|---|---|---|
| 6,211,327 | B1 * | 4/2001 | F. M. Braat | ........... C08G 65/44 264/459 |
| 7,413,791 | B2 * | 8/2008 | Inoue | ................ B32B 15/14 428/141 |
| 2001/0053450 | A1 | 12/2001 | Yeager et al. | |
| 2002/0028337 | A1 | 3/2002 | Yeager et al. | |
| 2004/0146692 | A1 | 7/2004 | Inoue et al. | |

(Continued)

FOREIGN PATENT DOCUMENTS

| | | |
|---|---|---|
| CN | 1402750 | 3/2003 |
| CN | 1718634 | 1/2006 |

(Continued)

OTHER PUBLICATIONS

White, The Synthesis of 4-Hydroxyarylene Ethers by the Equilibration of Phenols with Poly(2,6-dimethyl-1,4-phenylene ether), The Journal of Organic Chemistry, vol. 84, No. 2, Feb. 1969 (Year: 1969).*

(Continued)

*Primary Examiner* — Hoa (Holly) Le
(74) *Attorney, Agent, or Firm* — Greenblum & Bernstein, P.L.C.

(57) ABSTRACT

A modified polyphenylene ether according to one aspect of the invention has an intrinsic viscosity, as measured in 25° C. methylene chloride, of from 0.03 to 0.12 dL/g, has on molecular ends thereof an average of 1.5 to 3 groups represented by formula (1) below per molecule, and includes not more than 5 mass % of a high-molecular-weight component having a molecular weight of 13,000 or more.

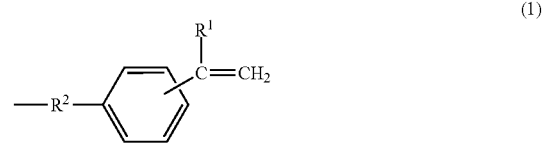

(1)

In formula (1), $R^1$ is a hydrogen atom or an alkyl group of 1 to 10 carbons, and $R^2$ is an alkylene group of 1 to 10 carbons.

15 Claims, No Drawings

(56) References Cited

U.S. PATENT DOCUMENTS

| | | |
|---|---|---|
| 2007/0129502 A1 | 6/2007 | Kawabe et al. |
| 2008/0254257 A1 | 10/2008 | Inoue et al. |
| 2009/0203279 A1 | 8/2009 | Mori et al. |
| 2013/0266779 A1 | 10/2013 | Tokiwa et al. |
| 2014/0235126 A1 | 8/2014 | Mori et al. |

FOREIGN PATENT DOCUMENTS

| | | |
|---|---|---|
| CN | 1914239 A | 2/2007 |
| CN | 101508844 A | 8/2009 |
| CN | 101624467 A | 1/2010 |
| JP | 2004-339328 A | 12/2004 |
| JP | 2008-260942 A | 10/2008 |
| JP | 2010-53178 A | 3/2010 |
| JP | 2010-195970 A | 9/2010 |
| JP | 2013-23517 A | 2/2013 |
| WO | 2004/067634 A1 | 8/2004 |
| WO | 2012/081705 A | 6/2012 |

OTHER PUBLICATIONS

Office Action issued in China Counterpart Patent Appl. No. 201380038676.3, dated Nov. 10, 2015, along with an English translation thereof.
International Search Report, dated Oct. 8, 2013 for Patent Application No. PCT/JP2013/005060.
Taiwan Office Action, dated Oct. 17, 2014 for Patent Application No. 102130810.

\* cited by examiner

MODIFIED POLYPHENYLENE ETHER, METHOD FOR PREPARING SAME, POLYPHENYLENE ETHER RESIN COMPOSITION, RESIN VARNISH, PREPREG, METAL-CLAD LAMINATE AND PRINTED CIRCUIT BOARD

TECHNICAL FIELD

This invention relates to a modified polyphenylene ether, a method of preparing the same, a polyphenylene ether resin composition, a resin varnish, a prepreg, a metal-clad laminate and a printed circuit board.

BACKGROUND ART

Polyphenylene ethers are known to be endowed with excellent dielectric properties such as dielectric constant and loss tangent, and to have excellent dielectric properties even in the high-frequency band (high-frequency region) from the MHz band to the GHz band. Hence, polyphenylene ethers are being investigated to determine whether they can be used as, for example, a molding material for high-frequency applications. Specifically, their suitability for use as, e.g., a substrate material for printed circuit boards to be provided in electronic equipment that utilizes the high-frequency band, is under investigation.

At the same time, when used as a molding material for substrate materials and the like, in addition to have excellent dielectric properties, polyphenylene ethers are also required to have excellent heat resistance and moldability. However, because polyphenylene ethers are thermoplastic, they have sometimes lacked the ability to achieve a sufficient heat resistance. It is thus conceivable, for example, to use a polyphenylene ether to which a thermoset resin such as an epoxy resin has been added or to use a modified polyphenylene ether.

Modified polyphenylene ethers are exemplified by, for example, the modified polyphenylene ether compounds described in Patent Document 1.

Patent Document 1 describes a modified polyphenylene ether compound having a given polyphenylene ether moiety within the molecular structure and having on molecular ends thereof at least one p-ethenylbenzyl group, m-ethenylbenzyl group or the like.

Modified polyphenylene ether-containing resin compositions are exemplified by the polyphenylene ether resin composition described in Patent Document 2.

Patent Document 2 describes a polyphenylene ether resin composition which contains a polyphenylene ether having a polyphenylene ether moiety within the molecular structure, having a p-ethenylbenzyl group or a m-ethenylbenzyl group on a molecular end thereof and having a number-average molecular weight of from 1,000 to 7,000, and also contains a crosslinking type curing agent.

Polyphenylene ethers generally have a relatively high molecular weight and a high softening point, and thus tend to have a high viscosity and low flow properties. When such polyphenylene ethers are used to form prepregs for use in the manufacture of multilayer printed circuit boards or the like, and the prepregs thus formed are used to manufacture printed circuit boards, there has been a risk of moldability problems occurring; that is, of molding defects such as voids arising during multilayer molding, making printed circuit boards of high reliability difficult to achieve.

To keep such problems from occurring, the inventors have investigated the use of relatively low-molecular-weight polyphenylene ethers. However, the inventors have found from these investigations that when a polyphenylene ether whose molecular weight was simply lowered in this way is used, even with use in combination with a thermoset resin or the like, the resin composition does not sufficiently cure, as a result of which adequately increasing the heat resistance of the cured product has tended to be impossible.

Also, Patent Document 1 discloses that there can be obtained a modified polyphenylene ether compound which has an improved solder heat resistance and moldability while retaining excellent dielectric properties. Patent Document 2 discloses that, even when a low-molecular-weight polyphenylene ether is used for greater convenience during prepreg production without lowering the dielectric properties, there can be obtained a polyphenylene ether resin composition from which a laminate endowed with, for example, a high heat resistance and high moldability can be formed.

In addition, as mentioned in Patent Documents 1 and 2, there also exists a desire to increase the moldability and heat resistance of cured products beyond the levels attainable when a modified phenylene ether compound is used. In other words, there is a desire to both have the excellent dielectric properties of a polyphenylene ether, and moreover to further increase the moldability and heat resistance of cured products obtained therefrom.

To this end, in order to further increase the moldability and heat resistance of cured products, there exists a desire for a modified polyphenylene ether compound which not only has an excellent reactivity that contributes to the curing reaction and an excellent storage stability, but also has a low viscosity and excellent flow properties.

CITATION LIST

Patent Literature

Patent Document 1: Japanese Unexamined Patent Publication No. 2004-339328
Patent Document 2: WO 2004/067634

SUMMARY OF INVENTION

In light of such circumstances, the object of this invention is to provide a modified polyphenylene ether which has the excellent dielectric properties of a polyphenylene ether, possesses an excellent reactivity that contributes to the curing reaction and an excellent storage stability, and also has a low viscosity and excellent flow properties. A further object is to provide a method of preparing such a modified polyphenylene ether.

The modified polyphenylene ether according to one aspect of the invention is a modified polyphenylene ether having an intrinsic viscosity, as measured in 25° C. methylene chloride, of from 0.03 to 0.12 dL/g, having on molecular ends thereof an average of 1.5 to 3 groups represented by formula (1) per molecule, and including not more than 5 mass % of a high-molecular-weight component having a molecular weight of 13,000 or more.

[C1]

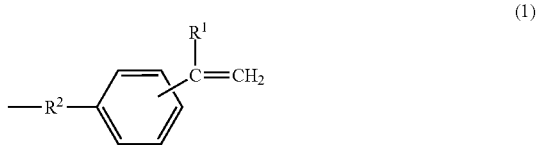

(1)

In formula (1), R¹ is a hydrogen atom or an alkyl group of 1 to 10 carbons, and R² is an alkylene group of 1 to 10 carbons.

The method of preparing a modified polyphenylene ether according to another aspect of the invention is a method of preparing the above modified polyphenylene ether including reacting a polyphenylene ether having an intrinsic viscosity, as measured in 25° C. methylene chloride, of from 0.03 to 0.12 dL/g, having on molecular ends thereof an average of from 1.5 to 3 phenolic hydroxyl groups per molecule, and including not more than 5 mass % of a high-molecular-weight component having a molecular weight of 13,000 or more with a compound represented by formula (3) below.

[C2]

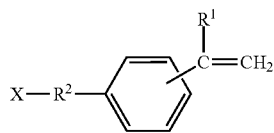

(3)

In formula (3), R¹ is a hydrogen atom or an alkyl group of 1 to 10 carbons, R² is an alkylene group of 1 to 10 carbons, and X is a halogen atom.

The polyphenylene ether resin composition according to yet another aspect of the invention is a polyphenylene ether resin composition which includes the above modified polyphenylene ether or a modified polyphenylene ether obtained by the foregoing modified polyphenylene ether preparation method, and a heat-curing type curing agent.

The resin varnish according to a further aspect of the invention is a resin varnish which includes the foregoing polyphenylene ether resin composition and a solvent.

The prepreg according to a still further aspect of the invention is a prepreg obtained by impregnating the foregoing polyphenylene ether resin composition into a fibrous base material.

The metal-clad laminate according to another aspect of the invention is a metal-clad laminate obtained by laminating metal foil on the foregoing prepreg, and molding under applied heat and pressure.

The printed circuit board according to yet another aspect of the invention is a printed circuit board manufactured using the foregoing prepreg.

The objects, features, aspects and advantages of the invention will become more apparent from the following detailed description.

DESCRIPTION OF EMBODIMENTS

The modified polyphenylene ether according to an embodiment of the invention is a modified polyphenylene ether having an intrinsic viscosity, as measured in 25° C. methylene chloride, of from 0.03 to 0.12 dL/g, having on molecular ends thereof an average of 1.5 to 3 groups represented by formula (1) per molecule, and including not more than 5 mass % of a high-molecular-weight component having a molecular weight of 13,000 or more. Such modified polyphenylene ethers have the excellent dielectric properties of polyphenylene ethers, have an excellent reactivity that contributes to the curing reaction and an excellent storage stability, and moreover have a low viscosity and excellent flow properties. In addition, by using such a modified polyphenylene ether, there can be obtained a resin composition which has the excellent dielectric properties of polyphenylene ethers and cured products of which have an excellent moldability and heat resistance.

This is presumably on account of the following.

First, it is thought that this modified polyphenylene ether is curable by the polymerization of groups represented by formula (1) present on the molecular ends. Also, presumably, the modified polyphenylene ether retains the excellent dielectric properties of polyphenylene ethers because, apart from the molecular ends, it is a polyphenylene ether.

Moreover, it is conceivable that this modified polyphenylene ether is able to cure well because it has on the molecular ends thereof an average of 1.5 to 3 groups represented by formula (1) per molecule, which is relatively numerous. That is, it is thought to have an excellent reactivity which contributes to the curing reaction. As a result, cured products of excellent heat resistance can presumably be obtained.

Furthermore, it is conceivable that because this modified polyphenylene ether has a relatively low viscosity, the flow properties are excellent, resulting in an excellent cured-product moldability.

Not only does this modified polyphenylene ether have a relatively low average molecular weight, because the content of the high-molecular-weight component having a molecular weight of 13,000 or more is low, i.e. not more than 5 mass %, the molecular weight distribution is relatively narrow. This presumably enables the various above effects to be better manifested. For example, the modified polyphenylene ether appears as a result to have an even better reactivity that contributes to the curing reaction, thereby giving a cured product having an even better heat resistance. Moreover, it is conceivable that this results in even better flow properties and even better cured product moldability.

Given the above, it is presumed that by using this modified polyphenylene ether, there can be obtained a resin composition having the excellent dielectric properties of polyphenylene ethers and cured products of which have an excellent moldability and heat resistance.

In formula (1), R¹ is a hydrogen atom or an alkyl group of 1 to 10 carbons. The alkyl group is not particularly limited provided it has from 1 to 10 carbons, and may be linear or branched. Specific examples of such alkyl groups include methyl, ethyl, n-propyl, isopropyl, n-butyl, isobutyl, s-butyl, t-butyl, pentyl, isopentyl, neopentyl and hexyl groups. Of the above, a hydrogen atom is preferred.

In formula (1), R² is an alkylene group of from 1 to 10 carbons. Specific examples of the alkylene group having from 1 to 10 carbons include methylene, ethylene, propylene, butylene, pentylene, hexylene, heptylene, octylene, nonylene and decylene groups. Of these, a methylene group is preferred.

The group represented by formula (1) is not particularly limited, although p-ethenylbenzyl and m-ethenylbenzyl are preferred.

The group represented by formula (1) may be one of the above exemplary groups used alone or may be two or more used in combination.

The intrinsic viscosity of the modified polyphenylene ether according to this embodiment may be from 0.03 to 0.12 dL/g, although the intrinsic viscosity is preferably from 0.04 to 0.11 dL/g, and more preferably from 0.06 to 0.095 dL/g. If this intrinsic viscosity is too low, the molecular weight tends to be low and low dielectric properties such as a low dielectric constant and a low tangent tend to be difficult to achieve. On the other hand, if the intrinsic viscosity is too high, the viscosity is high, sufficient flow properties cannot be obtained, and the cured product moldability tends to decrease. Accordingly, if the intrinsic viscosity of the modified polyphenylene ether falls within the above range, an excellent cured product heat resistance and moldability can be achieved.

As used herein, "intrinsic viscosity" refers to the intrinsic viscosity measured in 25° C. methylene chloride. More specifically, this is the value obtained by measuring, for example, a 0.18 g/45 mL methylene chloride solution (liquid temperature, 25° C.) with a viscometer. The viscometer may be, for example, the AVS500 Visco System available from Schott Instruments GmbH.

The modified polyphenylene ether according to this embodiment must have on molecular ends thereof an average number of 1.5 to 3 groups represented by formula (1) (number of terminal functional groups) per molecule, although the average number of such groups is preferably from 1.7 to 2.7, and more preferably from 1.8 to 2.5. If the number of such functional groups is too small, crosslink sites may not readily form, as a result of which cured products of sufficient heat resistance tend to be difficult to obtain. On the other hand, if the number of terminal functional groups is too large, the reactivity becomes excessively high, which may lead to undesirable effects, for example, a decrease in the storage stability of the resin composition or a decline in the flow properties of the resin composition. That is, when such a modified polyphenylene ether is used, insufficient flow properties and the like may give rise to a moldability problem; namely, molding defects such as void formation during multilayer molding may occur, making it difficult to obtain printed circuit boards having a high reliability.

The number of terminal functional groups on the modified polyphenylene ether is exemplified by a number that expresses the average number of groups represented by formula (1) per molecule for all the modified polyphenylene ether present in a mole of modified polyphenylene ether. This number of terminal functional groups can be measured by, for example, determining the number of hydroxyl groups remaining on the resulting modified polyphenylene ether and calculating the amount of decrease from the number of hydroxyl groups on the polyphenylene ether prior to modification. The amount of decrease from the number of hydroxyl groups on the polyphenylene ether prior to modification is the number of terminal functional groups. The number of hydroxyl groups remaining on the modified polyphenylene ether can be measured by adding, to a solution of the modified polyphenylene ether, a quaternary ammonium salt (tetraethylammonium hydroxide) which associates with hydroxyl groups and measuring the UV absorbance of this mixed solution.

The modified polyphenylene ether of this embodiment has a content of not more than 5 mass % of a high-molecular-weight component having a molecular weight of 13,000 or more. That is, this modified polyphenylene ether preferably has a molecular weight distribution that is relatively narrow. This modified polyphenylene ether has a low content of a high-molecular-weight component having a molecular weight of 13,000 or more which is preferably low, and may contain no such high-molecular-weight component. That is, the lower limit of the range in the content of the high-molecular-weight component having a molecular weight of 13,000 or more may be 0 mass %. The content of the high-molecular-weight component having a molecular weight of 13,000 or more within the modified polyphenylene ether should be from 0 to 5 mass %, and is more preferably from 0 to 3 mass %. With a modified polyphenylene ether thus having a high-molecular-weight component content that is low and a narrow molecular weight distribution, the reactivity that contributes to the curing reaction tends to be higher and the flow properties tend to be better. This is presumably because, if the content of the high-molecular-weight component is too high, even when the average molecular weight is low, the influence of the high-molecular-weight component emerges, whereas if the content of the high-molecular-weight components is low, this influence becomes smaller.

The content of this high-molecular-weight component can be obtained by measuring the molecular weight distribution using gel permeation chromatography (GPC), followed by calculation based on the measured molecular weight distribution. Specifically, the content can be calculated from the ratio of the peak surface area based on the curve showing the molecular weight distribution obtained by GPC.

The modified polyphenylene ether according to this embodiment has polyphenylene ether chains within the molecule. For example, it preferably has recurring units represented by formula (2) below within the molecule.

[C3]

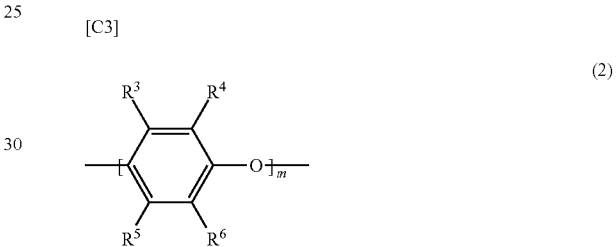

(2)

In formula (2), "m" is from 1 to 50. $R^3$, $R^4$, $R^5$ and $R^6$ are each independent. That is, $R^3$, $R^4$, $R^5$ and $R^6$ may each be the same group or different groups. $R^3$, $R^4$, $R^5$ and $R^6$ each represent a hydrogen atom, an alkyl group, an alkenyl group, an alkynyl group, a formyl group, an alkylcarbonyl group, an alkenylcarbonyl group or an alkynylcarbonyl group. Of these, a hydrogen atom and an alkyl group are preferred.

The respective functional groups mentioned in $R^3$ to $R^6$ are exemplified as follows.

The alkyl group, although not particularly limited, is preferably, for example, an alkyl group of 1 to 18 carbons, and more preferably an alkyl group of 1 to 10 carbons. Specific examples include methyl, ethyl, propyl, hexyl and decyl groups.

The alkenyl group, although not particularly limited, is preferably, for example, an alkenyl group of 2 to 18 carbons, and more preferably an alkenyl group of 2 to 10 carbons. Specific examples include vinyl, allyl, and 3-butenyl groups.

The alkynyl group, although not particularly limited, is preferably, for example, an alkynyl group of 2 to 18 carbons, and more preferably an alkynyl group of 2 to 10 carbons. Specific examples include ethynyl and prop-2-yn-1-yl (propargyl) groups.

The alkylcarbonyl group is not particularly limited so long as it is, for example, a carbonyl group substituted with an alkyl group, although it is preferably an alkylcarbonyl group of 2 to 18 carbons, and more preferably an alkylcarbonyl group of 2 to 10 carbons. Specific examples include acetyl, propionyl, butyryl, isobutyryl, pivaloyl, hexanoyl, octanoyl and cyclohexylcarbonyl groups.

The alkenylcarbonyl group is not particularly limited so long as it is, for example, a carbonyl group substituted with an alkenyl group, although it is preferably an alkenylcarbonyl group of 3 to 18 carbons, and more preferably an alkenylcarbonyl group of 3 to 10 carbons. Specific examples include acryloyl, methacryloyl and crotonoyl groups.

The alkynylcarbonyl group is not particularly limited so long as it is, for example, a carbonyl group substituted with an alkynyl group, although it is preferably an alkynylcarbonyl group of 3 to 18 carbons, and more preferably an alkynylcarbonyl group of 3 to 10 carbons. An specific example is the propionoyl group.

The number-average molecular weight of the modified polyphenylene ether, although not particularly limited, is preferably from 1,000 to 5,000, more preferably from 1,000 to 4,000, and even more preferably from 1,000 to 3,000. In cases where the modified polyphenylene ether has recurring units represented by formula (2) on the molecule, "m" is preferably a numerical value such that the number-average molecular weight of the modified polyphenylene ether falls within this range. Specifically, "m" is preferably from 1 to 50. Here, the number-average molecular weight should be measured by a common method of measuring molecular weight, and is exemplified more specifically by a value measured using gel permeation chromatography (GPC).

When the number-average molecular weight of the modified polyphenylene ether falls within such a range, the modified polyphenylene ether has the excellent dielectric properties of a polyphenylene ether and cured products thereof have an even better moldability and heat resistance. This appears to be due to the following. In conventional polyphenylene ethers, when the number-average molecular weight falls within such a range, because the polyphenylene ether has a relatively low molecular weight, there is a tendency for the heat resistance of cured products obtained therefrom to decrease. In light of this, it is conceivable that a cured product heat resistance which is sufficiently high can be obtained because the modified polyphenylene ether according to this embodiment has an average of at least 1.5 unsaturated double bonds on the ends thereof. Also, when the number-average molecular weight of the modified polyphenylene ether falls within such a range, it has a relatively low molecular weight and thus, presumably, also has an excellent moldability. Hence, such modified polyphenylene ethers are capable of having, in cured products thereof, both excellent moldability and excellent heat resistance.

The method of preparing a modified polyphenylene ether is not particularly limited, provided it is capable of synthesizing a modified polyphenylene ether having an intrinsic viscosity, as measured in 25° C. methylene chloride, of from 0.03 to 0.12 dL/g, having on molecular ends thereof an average of 1.5 to 3 groups represented by formula (1) per molecule, and including not more than 5 mass % of a high-molecular-weight component having a molecular weight of 13,000 or more. An specific example is a method that involves reacting a polyphenylene ether having an intrinsic viscosity, as measured in 25° C. methylene chloride, of from 0.03 to 0.12 dL/g, having on molecular ends thereof an average of 1.5 to 3 phenolic hydroxyl groups per molecule and including not more than 5 mass % of a high-molecular-weight component having a molecular weight of 13,000 or more with a compound represented by formula (3).

In formula (3), $R^1$ and $R^2$ are the same as $R^1$ and $R^2$ in formula (1). Specifically, $R^1$ is a hydrogen atom or an alkyl group of 1 to 10 carbons, $R^2$ is an alkylene group of 1 to 10 carbons, and X is a halogen atom. X represents a halogen atom, specific examples of which include chlorine, bromine, iodine and fluorine atoms. Of these, a chlorine atom is preferred.

The compound represented by formula (3) is not particularly limited, although p-chloromethylstyrene and m-chloromethylstyrene are preferred.

The foregoing compounds may be used singly, or may be used in combinations of two or more thereof, as the compound represented by formula (3).

The polyphenylene ether serving as the starting material is not particularly limited, provided a predetermined modified polyphenylene ether can be ultimately synthesized. This is exemplified by polyphenylene ethers having an intrinsic viscosity, as measured in 25° C. methylene chloride, of from 0.03 to 0.12 dL/g, having on molecular ends thereof an average of 1.5 to 3 phenolic hydroxyl groups per molecule, and including not more than 5 mass % of a high-molecular-weight component having a molecular weight of 13,000 or more. Specific examples include polyarylene ether copolymers composed of 2,6-dimethylphenol and either of or both a bifunctional phenol and a trifunctional phenol, and starting polyphenylene ethers composed primarily of a polyphenylene ether such as poly(2,6-dimethyl-1,4-phenylene oxide). Here, "bifunctional phenol" refers to a phenol compound having two phenolic hydroxyl groups on the molecule, such as tetramethylbisphenol A. "Trifunctional phenol" refers to a phenol compound having three phenolic hydroxyl groups on the molecule. Such polyphenylene ethers include, for example, polyphenylene ethers having the structure shown in formula (4) below.

[C4]

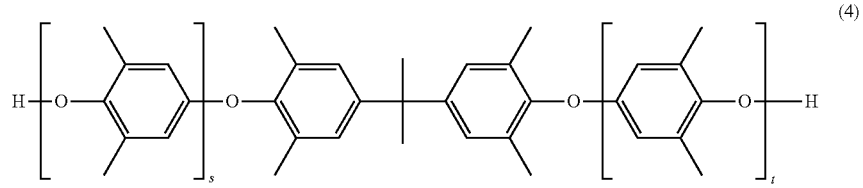

In formula (4), "s" and "t" may be degrees of polymerization such that the intrinsic viscosity falls within the range of 0.03 to 0.12 dL/g. Specifically, the combined value of "s" and "t" is preferably from 1 to 30. Moreover, "s" is preferably from 0 to 20, and "t" is preferably from 0 to 20. That is, it is preferable for "s" to be from 0 to 20, for "t" to be from 0 to 20, and for the sum of "s" and "t" to be from 1 to 30.

The method of preparing the modified polyphenylene ether is exemplified by the above-described method. Specifically, a polyphenylene ether like that described above and a compound represented by formula (3) are dissolved in a solvent and stirred, causing the polyphenylene ether and the compound represented by formula (3) to react and thereby giving a modified polyphenylene ether according to this embodiment.

It is preferable to carry out this reaction in the presence of an alkali metal hydroxide. Doing so suitably promotes the reaction, making it easier to obtain a modified polyphenylene ether having an average number of groups represented by formula (1) on the ends of the molecule (number of terminal functional groups), per molecule of the modified polyphenylene ether, of 1.5 to 3. This appears to be due to the fact that the alkali metal hydroxide functions as a dehydrohalogenating agent, and more specifically as a dehydrochlorinating agent. That is, the alkali metal hydroxide presumably removes hydrogen halide from the phenol groups of polyphenylene ether and the compound represented by formula (3), and bonds, in place of the hydrogen atoms on the phenol groups of the polyphenylene ether, groups represented by formula (1) to the oxygen atoms on the phenol groups.

The alkali metal hydroxide is not particularly limited, provided it is capable of functioning as a dehalogenating agent. An specific example is sodium hydroxide. The alkali metal hydroxide is generally used in the state of an aqueous solution. For example, this can be used as an aqueous solution of sodium hydroxide.

The reaction conditions such as reaction time and reaction temperature also differ according to, for example, the compound represented by formula (3), but are not particularly limited so long as they are conditions under which reactions like those described above can suitably proceed. More specifically, the reaction temperature is preferably from room temperature to 100° C., and more preferably from 30 to 100° C. The reaction time is preferably from 0.5 to 20 hours, and more preferably form 0.5 to 10 hours.

The solvent used in the reaction is not particularly limited, provided it is capable of dissolving the polyphenylene ether and the compound represented by formula (3) and does not hinder the reaction between the polyphenylene ether and the compound represented by formula (3). Toluene is an specific example.

The reaction is preferably carried out in a state where not only an alkali metal hydroxide, but also a phase transfer catalyst is present. That is, the reaction is preferably carried out in the presence of an alkali metal hydroxide and a phase transfer catalyst. This enables the above reaction to proceed well, and makes it easier to obtain a modified polyphenylene ether having on molecular ends thereof an average number of groups represented by formula (1) (number of terminal functional groups) per molecule of from 1.5 to 3. This is thought to be due to the fact that a phase transfer catalyst is a catalyst which has the function of taking up the alkali metal hydroxide, is soluble both in a polar solvent phase such as water and also in a nonpolar solvent phase such as an organic solvent, and is capable of migrating between these phases. Specifically, in cases where an aqueous sodium hydroxide solution is used as the alkali metal hydroxide and an organic solvent such as toluene which is incompatible with water is used as the solvent, even if the aqueous sodium hydroxide solution is added dropwise to the solvent that is furnished to the reaction, it is thought that the solvent and the aqueous sodium hydroxide solution separate and the sodium hydroxide does not readily migrate to the solvent. Hence, presumably, the aqueous sodium hydroxide solution added as the alkali metal hydroxide does little to promote the reaction. By contrast, when the reaction is carried out in the presence of an alkali metal hydroxide and a phase transfer catalyst, it is thought that the alkali metal hydroxide migrates to the solvent after having been taken up by the phase transfer catalyst, enabling the aqueous sodium hydroxide solution to more readily promote the reaction. Accordingly, it is thought that by carrying out the reaction in the presence of an alkali metal hydroxide and a phase transfer catalyst, the above reaction is suitably promoted.

Examples of the phase transfer catalyst include, without particular limitation, quaternary ammonium salts such as tetra-n-butylammonium bromide.

The modified polyphenylene ether according to this embodiment can be used, together with a heat-curing type curing agent and other ingredients, as a polyphenylene ether resin composition. That is, the polyphenylene ether resin composition according to an embodiment of this invention includes the above modified polyphenylene ether and a heat-curing type curing agent. Such polyphenylene ether resin compositions retain the excellent dielectric properties of polyphenylene ethers and cured products thereof have an excellent moldability and heat resistance. This appears to be due to the inclusion of the foregoing modified polyphenylene ether. Specifically, it is thought that because the above modified polyphenylene ether has groups represented by formula (1) at the molecular ends thereof, by inducing a curing reaction with the heat-curing type curing agent, three-dimensional crosslinkages can be advantageously formed. It appears that the heat resistance of cured products thereof can be adequately increased by forming these three-dimensional crosslinkages.

Next, each of the ingredients in the polyphenylene ether resin composition according to this embodiment is explained below in turn.

The modified polyphenylene ether used in this embodiment is not particularly limited, provided it is a modified polyphenylene ether having an intrinsic viscosity, as measured in 25° C. methylene chloride, of from 0.03 to 0.12 dL/g, having on molecular ends thereof an average of 1.5 to 3 groups represented by formula (1) per molecule, and including not more than 5 mass % of a high-molecular-weight component having a molecular weight of 13,000 or more. This is exemplified by the modified polyphenylene ether described above.

The heat-curing type curing agent used in this embodiment may be, for example, one which, when reacted with the modified polyphenylene ether, forms crosslinkages and thereby induces curing. Such curing agents are exemplified by compounds having at least two unsaturated double bonds on the molecule. Specific examples include trialkenyl isocyanurate compounds such as triallyl isocyanurate (TAIC), polyfunctional methacrylate compounds having at least two methacryl groups on the molecule, polyfunctional acrylate compounds having at least two acryl groups on the molecule, polybutadiene and other vinyl compounds having at least two vinyl groups on the molecule (polyfunctional vinyl compounds), and vinylbenzyl compounds having at least two vinylbenzyl groups on the molecule. Of these, trialkenyl isocyanurate compounds, polyfunctional acrylate compounds having at least two acryl groups on the molecule, polyfunctional methacrylate compounds, and polyfunctional vinyl compounds are preferred. By using these, crosslinkages appear to be form more suitably due to the curing reaction, and the heat resistance of a cured product of the modified polyphenylene ether-containing resin composition according to this embodiment can be further increased. The above heat-curing type curing agents may be used singly or two or more may be used in combination. Alternatively, a compound having two or more unsaturated double bonds on the molecule may be used together with a compound having one unsaturated double bond on the molecule. Specific examples of compounds having one unsaturated double bond on the molecule include compounds having one vinyl group on the molecule (monovinyl compounds).

No particular limitation is imposed on the content of the modified polyphenylene ether, provided the modified polyphenylene ether is included in a proportion that induces a reaction with the heat-curing type curing agent and enables the formation of a cured product. For example, this content is preferably from 30 to 95 mass %, more preferably from 40 to 90 mass %, and even more preferably from 50 to 90 mass %, based on the combined amount of the modified polyphenylene ether and the heat-curing type curing agent. That is, the content of the heat-curing type curing agent, based on the combined amount of the modified polyphenylene ether and the heat-curing type curing agent, is preferably from 5 to 70 mass %, more preferably from 10 to 60 mass %, and even more preferably from 10 to 50 mass %. At such a content, a composition having an even better moldability and heat resistance in cured products thereof is obtained while retaining the excellent dielectric properties of the polyphenylene ether. This is thought to be due to the fact that crosslinkages are better formed by the curing reaction while maintaining a content of the polyphenylene ether component that is capable of exhibiting excellent dielectric properties.

The polyphenylene ether resin composition according to this embodiment may be composed of a modified polyphenylene ether and a heat-curing type curing agent, or may additionally include other ingredients. Examples of such other ingredients include inorganic fillers, fire retardants, additives and reaction initiators. Even in cases where other ingredients are included, the combined content of the modified polyphenylene ether and the heat-curing type curing agent, based on the polyphenylene ether resin composition, is preferably at least 30 mass %, more preferably from 30 to 90 mass %, and even more preferably from 40 to 80 mass %. Within this range, the desirable effect of being able to obtain a composition which retains the excellent dielectric properties of the polyphenylene ether yet for which the moldability and heat resistance of cured products thereof are excellent is not hindered by the other ingredients and can be fully exhibited.

As mentioned above, an inorganic filler may be included in the polyphenylene ether resin composition according to this embodiment. The inorganic filler, although not particularly limited, is exemplified by those added in order to increase the heat resistance and the fire retardance of cured products of the resin composition. By including an inorganic filler, properties such as heat resistance and fire retardance can be increased. Moreover, the polyphenylene ether-containing resin composition, when compared with epoxy resin compositions for ordinary insulating base materials, have a low crosslink density and cured products thereof have a high thermal expansion coefficient, especially a thermal expansion coefficient α2 at temperatures in excess of the glass transition temperature, which tends to be high. By including an inorganic filler, it is possible to achieve excellent dielectric properties, and also excellent heat resistance and fire retardance in cured products thereof, to reduce the thermal expansion coefficient in cured products thereof, particularly the thermal expansion coefficient α2 at temperatures in excess of the glass transition temperature, while having the viscosity of the composition when rendered into a varnish be low, and to increase the toughness of the cured product.

Specific examples of inorganic fillers include silica, alumina, talc, aluminum hydroxide, magnesium hydroxide, titanium oxide, mica, aluminum borate, barium sulfate and calcium carbonate. The inorganic filler may be used directly as is, although use of the inorganic filler after surface treatment with a vinylsilane-type, styrylsilane-type, methacrylsilane-type or acrylsilane-type silane coupling agent is especially preferred. Metal-clad laminates obtained using a resin composition formulated with an inorganic filler that has been surface-treated with such a silane coupling agent tend to have a high heat resistance at the time of moisture absorption and also tend to have a high interlaminar peel strength.

Also, in cases where an inorganic filler is included, the content thereof, based on the polyphenylene ether resin composition, is preferably from 5 to 60 mass %, more preferably from 10 to 60 mass %, and even more preferably from 15 to 50 mass %.

As mentioned above, the polyphenylene ether resin composition according to this embodiment may include a flame retardant. By including a flame retardant, the flame retardancy of cured products of the resin composition can be increased. The flame retardant is not particularly limited, and is exemplified by halogen-containing flame retardants such as bromine-containing flame retardants, and phosphorus-containing flame retardants. Specific examples of halogen-containing flame retardants include bromine-containing flame retardants such as pentabromodiphenyl ether, octabromodiphenyl ether, decabromodiphenyl ether, tetrabromobisphenol A and hexabromocyclododecane, and chlorine-containing flame retardants such as chlorinated paraffins. Specific examples of phosphorus-containing flame retardants include phosphoric acid esters such as condensed phosphoric acid esters and cyclic phosphoric acid esters, phosphazene compounds such as cyclic phosphazene compounds, phosphinic acid-type flame retardants such as metal salts of phosphinic acids (e.g., aluminum salts of dialkylphosphinic acids), and melamine-type flame retardants such as melamine phosphate and melamine polyphosphate. These flame retardants may be used singly or may be used as combinations of two or more thereof.

As mentioned above, the polyphenylene ether resin composition according to this embodiment may include additives. Examples of such additives include foam inhibitors such as silicone-based foam inhibitors, and acrylic acid ester-based foam inhibitors, heat stabilizers, antistatic agents, ultraviolet absorbers, dyes and pigments, lubricants, and dispersants such as wetting and dispersing agents.

As mentioned above, the polyphenylene ether resin composition according to this embodiment may also include a reaction initiator. Even when the polyphenylene ether resin composition is composed of a modified polyphenylene ether and a heat-curing type curing agent, the curing reaction is able to proceed. In fact, the curing reaction is able to proceed even when the composition includes only a modified polyphenylene ether. However, because there are cases where, depending on the process conditions, setting the reaction system to a high temperature until curing proceeds would pose problems, a reaction initiator may be added. The reaction initiator is not particularly limited, so long as it is able to promote the curing reaction between the modified polyphenylene ether and the heat-curing type curing agent. Specific examples include the following oxidizing agents: α,α'bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butyl-phenoxyl, t-butylperoxyisopropyl monocarbonate and azobisisobutyronitrile. If necessary, a carboxylic acid metal salt may be used together. The curing reaction can be further promoted in this way. Of these, the use of α,α'-bis(t-butylperoxy-m-isopropyl)benzene is preferred. Because α,α'-bis(t-butylperoxy-m-isopropyl)benzene has a relatively high reaction initiation temperature, promotion of the curing reaction can be suppressed at times where curing is not required, such as during drying of the prepreg, thus making it possible to minimize declines in the storage stability of the polyphenylene ether resin composition. In addition, because α,α'-bis(t-butylperoxy-m-isopropyl)benzene has a low volatility, it does not volatize during prepreg drying or storage, and thus has a good stability. The reaction initiator may be used singly or two or more may be used in combination.

At the time of prepreg production, the polyphenylene ether resin composition according to this composition may be prepared and used in the form of a varnish for the purpose of impregnation into a base material (fibrous base material) for prepreg formation. That is, the polyphenylene ether resin composition may generally be prepared in the form of a varnish (resin varnish). In other words, the resin varnish according to an embodiment of the invention includes the above polyphenylene ether resin composition and a solvent. Such a resin varnish may be prepared, for example, in the following way.

First, the ingredients that can dissolve in the organic solvent, such as the modified polyphenylene ether and the heat-curing type curing agent, are poured into the organic solvent and dissolved. If necessary, heating may be carried out at this time. Then, ingredients which are optionally used and do not dissolve in the organic solvent, such as inorganic fillers, are added and, using a ball mill, bead mill, planetary mixer, roll mill or the like, are dispersed until they reach a given dispersed state, thereby preparing a varnish-type resin composition. The organic solvent used here is not particularly limited, provided it dissolves the modified polyphenylene ether, the heat-curing type curing agent and the like, and does not hinder the curing reaction. An specific example is toluene.

The polyphenylene ether resin composition according to this embodiment may be rendered into a prepreg by impregnation into a fibrous base material. That is, the prepreg according to an embodiment of the invention is obtained by impregnating the foregoing polyphenylene ether resin composition into a fibrous base material. An example of a method for producing such a prepreg entails impregnating the resin varnish that has been obtained (the resin composition that has been prepared in the form of a varnish) into a fibrous base material, then drying.

Examples of fibrous base materials that may be used to produce the prepreg include glass cloth, aramid cloth, polyester cloth, glass nonwoven fabric, aramid nonwoven fabric, polyester nonwoven fabric, pulp paper and cotton linter paper. By using glass cloth, a laminate of excellent mechanical strength is obtained. Glass cloth that has been subjected to flattening treatment is preferred. A specific example of flattening treatment may be continuous pressing of the glass cloth with a pressure roller at a suitable pressure and thereby compressing the yarn so it is flat. A fibrous base material having a thickness of, for example, from 0.04 to 0.3 mm, can generally be used.

Impregnation of the resin varnish into the fibrous base material is carried out by dipping and coating, etc. If necessary, such impregnation may be repeated a plurality of time. Moreover, it is possible at this time to repeatedly carry out impregnation using a plurality of resin varnishes of differing compositions and concentrations so as to ultimately adjust the prepreg to the desired composition and amount of resin.

The fibrous base material that has been impregnated with the resin varnish is heated under the desired heating conditions, such as at 80 to 170° C. for 1 to 10 minutes, thereby obtaining a prepreg in a semi-cured state (B stage).

The method of producing a metal-clad laminate using the prepreg thus obtained may entail using a single prepreg or stacking together a plurality of such prepregs, then placing a metal foil such as copper foil, either on both the top and bottom sides or on only one side of the single prepreg or prepreg stack, and integrally laminating the resulting assembly by molding under applied heat and pressure so as to produce a laminate clad on one or both sides with metal foil. The heating and pressing conditions may be suitably set according to such factors as the thickness of the laminate to be produced and the type of prepreg resin composition. For example, the temperature may be set to 170 to 210° C., the pressure may be set to 1.5 to 4.0 MPa, and the time may be set to 60 to 150 minutes.

The polyphenylene ether resin composition has the outstanding dielectric properties of polyphenylene ether, and cured products thereof have excellent moldability and heat resistance. As a result, the metal-clad laminate obtained with the prepreg formed using the polyphenylene ether resin composition has excellent dielectric properties and heat resistance, enabling the manufacture of a printed circuit board in which the occurrence of molding defects has been minimized.

Moreover, by etching or otherwise processing the metal foil at the surface of the laminate thus produced to form circuits, it is possible to obtain a printed circuit board having a conductor pattern provided as a circuit on the surface of the laminate. The resulting printed circuit board has excellent dielectric properties and heat resistance, and the occurrence of molding defects therein has been minimized.

The invention is illustrated more fully below by way of working examples, although the scope of the invention is not thereby limited.

EXAMPLES

First, a modified polyphenylene ether was synthesized. The intrinsic viscosity as measured in 25° C. methylene chloride is indicated below as the "intrinsic viscosity (IV)." Also, the average number of phenolic hydroxyl groups on molecular ends per molecule of the polyphenylene ether is indicated as the "number of terminal hydroxyl groups."

[Synthesis of Modified Polyphenylene Ether A (Modified PPE A)]

Polyphenylene ether and chloromethylstyrene were reacted together.

First, a 1-liter three-neck flask fitted with a temperature regulator, a stirrer, a cooling apparatus and a dropping funnel was charged with 200 g of polyphenylene ether (a polyphenylene ether having the structure shown in formula (4): SA90, available from SABIC's Innovative Plastics; intrinsic viscosity (IV), 0.083 dL/g; number of terminal hydroxyl groups, 1.9; number-average molecular weight Mn, 2,000), 30 g of a 50:50 by mass mixture of p-chloromethylstyrene and m-chloromethylstyrene (chloromethylstyrene (CMS) available from Tokyo Chemical Industry Co., Ltd.), 1.227 g of tetra-n-butylammonium bromide as the phase transfer catalyst and 400 g of toluene, and the flask contents were stirred. Stirring was carried out until the polyphenylene ether, the chloromethylstyrene and the tetra-n-butylammonium bromide dissolved in the toluene, during which time the flask contents were gradually heated to an ultimate liquid temperature of 75° C. To this solution was added dropwise, over a period of 20 minutes, an aqueous sodium hydroxide solution (20 g of sodium hydroxide/20 g of water) as the alkali metal hydroxide. This was followed by 4 hours of stirring at 75° C. Next, the flask contents were neutralized with 10 mass % hydrochloric acid, following which a large amount of methanol was poured in, causing a precipitate to form in the liquid within the flask. That is, the reaction product present in the reaction mixture within the flask was re-precipitated. This precipitate was collected by filtration, rinsed three times with an 80:20 by weight mixture of methanol and water, then dried under reduced pressure at 80° C. for 3 hours.

The solids thus obtained were analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. Specifically, this was confirmed to be an ethenylbenzylated polyphenylene ether.

The number of terminal functional groups on the modified polyphenylene ether was measured as follows.

First, the modified polyphenylene ether was precisely weighed and the weight at this time was set as X (mg). This modified polyphenylene ether that had been weighed was dissolved in 25 mL of methylene chloride and to this solution was added 100 μL of a 10 mass % solution of tetraethylammonium hydroxide (TEAH) in ethanol (TEAH: ethanol (volumetric ratio)=15:85), following which the absorbance (Abs) at 318 nm was measured using a UV spectrophotometer (UV-1600, from Shimadzu Corporation). The number of terminal hydroxyl groups on the modified polyphenylene ether was then calculated from these measurement results using the following formula.

Amount of remaining OH (μmol/g)=[(25×Abs)/(ε× OPL×X)]×10$^6$

Here, ε represents the extinction coefficient, which is 4,700 L/mol·cm. OPL is the optical path length of the cell, which is 1 cm.

Next, given that this calculated amount of remaining OH (number of terminal hydroxyl groups) on the modified polyphenylene ether was substantially zero, it was apparent that substantially all the hydroxyl groups on the polyphenylene ether prior to modification had been modified. It was found from this fact that the amount of decrease from the number of terminal hydroxyl groups on the polyphenylene ether prior to modification was the number of terminal hydroxyl groups on the polyphenylene ether prior to modification. That is, the number of terminal hydroxyl groups on the polyphenylene ether prior to modification was found to be the number of terminal functional groups on the modified polyphenylene ether. That is, the number of terminal functional groups was 1.9.

In addition, the intrinsic viscosity (IV) of the modified polyphenylene ether in 25° C. methylene chloride was measured. Specifically, the intrinsic viscosity (IV) of the modified polyphenylene ether was determined by measuring a 0.18 g/45 mL solution of the modified polyphenylene ether in methylene chloride (liquid temperature, 25° C.) with a viscometer (the AVS500 Visco System from Schott Instruments GmbH). As a result, the intrinsic viscosity (IV) of the modified polyphenylene ether was 0.086 dL/g.

The molecular weight distribution of the modified polyphenylene ether was measured by GPC. Next, the number-average molecular weight (Mn) and the content of the high-molecular-weight component having a molecular weight of 13,000 or more were calculated from the resulting molecular weight distribution. The content of the high-molecular-weight component was calculated from the ratio of the peak surface area based on the curve indicating the molecular weight distribution obtained by GPC. As a result, Mn was 2,300 and the content of the high-molecular weight component was 0.1 mass %.

[Synthesis of Modified Polyphenylene Ether B (Modified PPE B)]

Aside from using the subsequently described polyphenylene ether and employing the subsequently described conditions, synthesis was carried out by the same method as for the synthesis of modified PPE A.

The polyphenylene ether used was one obtained by rearrangement of a polyphenylene ether having the structure shown in formula (4): SA90, available from SABIC's Innovative Plastics; intrinsic viscosity (IV), 0.083 dL/g; number of terminal hydroxyl groups, 1.9; number-average molecular weight Mn, 2,000). Rearrangement was carried out as follows.

First, 200 g of the above polyphenylene ether (SA90), 40 g of bisphenol A as the phenol, and 40 g of benzoyl peroxide (Nyper BW, from NOF Corporation) as the initiator were each blended together, then 400 g of the solvent toluene was added thereto, followed by 1 hour of mixture at 90° C. This gave a rearranged polyphenylene ether.

Next, aside from using, in the reaction of the polyphenylene ether with the chloromethylstyrene, 200 g of the above rearranged polyphenylene ether, 65 g of CMS and 1.92 g of phase transfer catalyst (tetra-n-butylammonium bromide), and using an aqueous sodium hydroxide solution consisting of 40 g of sodium hydroxide in 40 g of water instead of an aqueous sodium hydroxide solution consisting of 20 g of sodium hydroxide in 20 g of water, synthesis was carried out by the same method as for the synthesis of modified PPE A.

The solid obtained as described above was analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. More specifically, this was confirmed to be an ethenylbenzylated polyphenylene ether.

The number of terminal functional groups on the modified polyphenylene ether was measured by the same method as described above. As a result, the number of terminal functional groups was 2.

The intrinsic viscosity (IV) of the modified polyphenylene ether in 25° C. methylene chloride was measured by the same method as that described above. The intrinsic viscosity (IV) of the modified polyphenylene ether thus obtained was 0.065 dL/g.

The Mn and the content of the high-molecular-weight component for the modified polyphenylene ether were measured by the same method as described above. As a result, Mn was 1,000. The content of the high-molecular-weight component was 0.1 mass %.

[Synthesis of Modified Polyphenylene Ether C (Modified PPE C)]

Aside from using the subsequently described polyphenylene ether and employing the subsequently described conditions, synthesis was carried out by the same method as for the synthesis of modified PPE A.

The polyphenylene ether used was one obtained by rearrangement of the polyphenylene ether available as noryl 640-111 from SABIC's Innovative Plastics (intrinsic viscosity (IV), 0.45 dL/g; number of terminal hydroxyl groups, 2; number-average molecular weight Mn, 20,000). Rearrangement was carried out as follows.

First, 200 g of the above polyphenylene ether (noryl 640-111), 65 g of bisphenol A as the phenol and 65 g of benzoyl peroxide (Nyper BW, from NOF Corporation) as the initiator were blended together, then 400 g of the solvent toluene was added thereto, followed by 1 hour of mixture at 90° C. This gave a rearranged polyphenylene ether.

Next, aside from using, in the reaction of the polyphenylene ether with the chloromethylstyrene, 200 g of the above rearranged polyphenylene ether, 65 g of CMS and 1.92 g of phase transfer catalyst (tetra-n-butylammonium bromide), and using an aqueous sodium hydroxide solution consisting of 40 g of sodium hydroxide in 40 g of water instead of an aqueous sodium hydroxide solution consisting of 20 g of sodium hydroxide in 20 g of water, synthesis was carried out by the same method as for the synthesis of modified PPE A.

The solid obtained as described above was analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. More specifically, this was confirmed to be an ethenylbenzylated polyphenylene ether.

The number of terminal functional groups on the modified polyphenylene ether was measured by the same method as described above. As a result, the number of terminal functional groups was 2.

The intrinsic viscosity (IV) of the modified polyphenylene ether in 25° C. methylene chloride was measured by the same method as that described above. The intrinsic viscosity (IV) of the modified polyphenylene ether thus obtained was 0.068 dL/g.

The Mn and the content of the high-molecular-weight component for the modified polyphenylene ether were measured by the same method as described above. As a result, Mn was 1,000. The content of the high-molecular-weight component was 3 mass %.

[Synthesis of Modified Polyphenylene Ether D (Modified PPE D)]

Aside from using the subsequently described polyphenylene ether and employing the subsequently described conditions, synthesis was carried out by the same method as for the synthesis of modified PPE A.

The polyphenylene ether used was one having the structure shown in formula (4) available as SA120 from SABIC's Innovative Plastics (intrinsic viscosity (IV), 0.125 dL/g; number of terminal hydroxyl groups, 1; number-average molecular weight Mn, 3,100).

Next, aside from using, in the reaction of the polyphenylene ether with the chloromethylstyrene, 200 g of the above polyphenylene ether (SA120), 15 g of CMS and 0.92 g of phase transfer catalyst (tetra-n-butylammonium bromide), and using an aqueous sodium hydroxide solution consisting of 10 g of sodium hydroxide in 10 g of water instead of an aqueous sodium hydroxide solution consisting of 20 g of sodium hydroxide in 20 g of water, synthesis was carried out by the same method as for the synthesis of modified PPE A.

The solid obtained as described above was analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. This was confirmed to be an ethenylbenzylated polyphenylene ether.

The number of terminal functional groups on the modified polyphenylene ether was measured by the same method as described above. As a result, the number of terminal functional groups was 0.9.

The intrinsic viscosity (IV) of the modified polyphenylene ether in 25° C. methylene chloride was measured by the same method as that described above. The intrinsic viscosity (IV) of the modified polyphenylene ether thus obtained was 0.125 dL/g.

The Mn and the content of the high-molecular-weight component for the modified polyphenylene ether were measured by the same method as described above. As a result, Mn was 3,300. The content of the high-molecular-weight component was 0.1 mass %.

[Synthesis of Modified Polyphenylene Ether E (Modified PPE E)]

Aside from using the subsequently described polyphenylene ether and employing the subsequently described conditions, synthesis was carried out by the same method as for the synthesis of modified PPE A.

The polyphenylene ether used was one obtained by rearrangement of the polyphenylene ether available as noryl 640-111 from SABIC's Innovative Plastics (intrinsic viscosity (IV), 0.45 dL/g; number of terminal hydroxyl groups, 2; number-average molecular weight Mn, 20,000). More specifically, rearrangement was carried out as follows.

First, 200 g of the above polyphenylene ether (noryl 640-111), 14 g of bisphenol A as the phenol and 14 g of benzoyl peroxide (Nyper BW, from NOF Corporation) as the initiator were blended together, then 400 g of the solvent toluene was added thereto, followed by 1 hour of mixture at 90° C. This gave a rearranged polyphenylene ether.

Next, aside from using, in the reaction of the polyphenylene ether with the chloromethylstyrene, 200 g of the above rearranged polyphenylene ether, 30 g of CMS and 1.227 g of phase transfer catalyst (tetra-n-butylammonium bromide), synthesis was carried out by the same method as for the synthesis of modified PPE A.

The solid obtained as described above was analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. More specifically, this was confirmed to be an ethenylbenzylated polyphenylene ether.

The number of terminal functional groups on the modified polyphenylene ether was measured by the same method as described above. As a result, the number of terminal functional groups was 2.

The intrinsic viscosity (IV) of the modified polyphenylene ether in 25° C. methylene chloride was measured by the same method as that described above. The intrinsic viscosity (IV) of the modified polyphenylene ether thus obtained was 0.095 dL/g.

The Mn and the content of the high-molecular-weight component for the modified polyphenylene ether were measured by the same method as described above. As a result, Mn was 2,400. The content of the high-molecular-weight component was 5.3 mass %.

[Synthesis of Modified Polyphenylene Ether F (Modified PPE F)]

Aside from using the subsequently described polyphenylene ether and employing the subsequently described conditions, synthesis was carried out by the same method as for the synthesis of modified PPE A.

The polyphenylene ether used was one obtained by rearrangement of the polyphenylene ether having the structure shown in formula (4), available as SA120 from SABIC's Innovative Plastics (intrinsic viscosity (IV), 0.125 dL/g; number of terminal hydroxyl groups, 1; number-average molecular weight Mn, 3,100). Rearrangement was carried out as follows.

First, 200 g of the above polyphenylene ether (SA 120), 25 g of bisphenol A as the phenol, and 25 g of benzoyl peroxide (Nyper BW, from NOF Corporation) as the initiator were blended together, then 400 g of the solvent toluene was added thereto, followed by 1 hour of mixture at 90° C. This gave a rearranged polyphenylene ether.

Next, aside from using, in the reaction of the polyphenylene ether with the chloromethylstyrene, 200 g of the above rearranged polyphenylene ether, 15 g of CMS and 0.92 g of phase transfer catalyst (tetra-n-butylammonium bromide), and using an aqueous sodium hydroxide solution consisting of 10 g of sodium hydroxide in 10 g of water instead of an aqueous sodium hydroxide solution consisting of 20 g of sodium hydroxide in 20 g of water, synthesis was carried out by the same method as for the synthesis of modified PPE A.

The solid obtained as described above was analyzed by $^1$H-NMR spectroscopy (400 MHz, CDCl$_3$, TMS). As a result of NMR measurement, a peak attributable to ethenylbenzyl was confirmed at 5 to 7 ppm. Hence, it was possible to confirm that the solid obtained was a modified polyphenylene ether having groups represented by formula (1) at the molecular ends thereof. This was confirmed to be an ethenylbenzylated polyphenylene ether.

The number of terminal functional groups on the modified polyphenylene ether was measured by the same method as described above. As a result, the number of terminal functional groups was 1.25.

The intrinsic viscosity (IV) of the modified polyphenylene ether in 25° C. methylene chloride was measured by the same method as that described above. The intrinsic viscosity (IV) of the modified polyphenylene ether thus obtained was 0.065 dL/g.

The Mn and the content of the high-molecular-weight component for the modified polyphenylene ether were measured by the same method as described above. As a result, Mn was 1,000. The content of the high-molecular-weight component was 0.1 mass %.

[Evaluation]

The modified polyphenylene ethers obtained were evaluated as follows.

(Viscosity):

First, using the modified polyphenylene ether obtained, a solution having a solids concentration of 50 mass % was prepared using a solvent (toluene). The temperature of this solution was set to 55° C. and the viscosity of the solution in this state was measured using a Brookfield viscometer.

(Storage Stability):

After measurement of its viscosity, the solution was left to stand one month in a water bath held isothermally at 25° C., following which, once again, the temperature of the solution was set to 55° C. and the viscosity of the solution in this state was measured using a Brookfield viscometer. Cases in which the percent increase in viscosity at that time was less than 30% were rated as "Good." Cases in which this was 30% or more were rated as "NG."

(Tg):

First, 70 parts by mass of the modified polyphenylene ether obtained and 30 parts by mass of triallyl isocyanurate (TAIC) were mixed, then toluene was added to obtain a solid concentration of 60 mass % and mixing was carried out. The resulting mixture was heated to 80° C. and stirred for 30 minutes at 80° C. Next, this stirred mixture was cooled to 40° C., after which 1 part by mass of 1,3-bis(butylperoxyisopropyl)benzene (Perbutyl P, from NOF Corporation) was added, thereby giving a resin composition in the form of a varnish (resin varnish).

Next, the resulting resin varnish was impregnated into glass cloth (#2116 type, WEA116E, E Glass; available from Nitto Boseki Co., Ltd.), then dried under applied heat at 130° C. for about 3 to 8 minutes, thereby giving a prepreg.

The Tg of this prepreg was measured using a DMS 100 dynamic mechanical spectrometer from Seiko Instruments. At this time, the frequency in the bending module was set to 10 Hz and dynamic mechanical analysis (DMS) was carried out. The temperature at which tan δ reaches a maximum when the temperature is raised at a rate of 5° C./min from room temperature to 280° C. was defined as Tg.

(Reactivity (ΔTg)):

The prepreg for which Tg had been measured was slowly cooled once to room temperature, following which the Tg was measured again by the same method as described above. The difference in these two measured Tg values (ΔTg) was evaluated. A larger ΔTg indicates a lower reactivity.

The results from each of the above tests are shown, together with various physical properties for the modified polyphenylene ethers, in Table 1.

TABLE 1

|  | Modified PPE A | Modified PPE B | Modified PPE C | Modified PPE D | Modified PPE E | Modified PPE F |
| --- | --- | --- | --- | --- | --- | --- |
| Mn | 2,300 | 1,000 | 1,000 | 3,300 | 2,400 | 1,000 |
| Content of high-molecular-weight component (mass %) | 0.1 | 0.1 | 3 | 0.1 | 5.3 | 0.1 |
| IV (dL/g) | 0.086 | 0.065 | 0.068 | 0.125 | 0.095 | 0.065 |
| Number of functional groups | 1.9 | 2 | 2 | 0.9 | 2 | 1.25 |
| Storage stability | good | good | good | NG | NG | good |
| Viscosity (mPa · s) | 50 | 30 | 35 | 600 | 100 | 30 |
| Tg (° c.) | 220 | 200 | 205 | 205 | 225 | 185 |
| ΔTg (° C.) | 5 | 3 | 4 | 15 | 8 | 12 |

As is apparent from Table 1, those modified polyphenylene ethers which have an intrinsic viscosity, as measured in 25° C. methylene chloride, of from 0.03 to 0.12 dL/g, have an average of 1.5 to 3 groups represented by formula (1) per molecule at molecular ends thereof and include not more than 5 mass % of a high-molecular-weight component having a molecular weight of 13,000 or more (namely, modified PPE A to C), when compared with modified polyphenylene ethers which do not satisfy these conditions (modified PPE D to F), have an excellent reactivity that contributes to the curing reaction and an excellent storage stability, and also have a low viscosity and excellent flow properties.

By using these modified polyphenylene ethers, it is thought to be possible to obtain resin compositions which have the excellent dielectric properties of polyphenylene ethers and the cured products of which have an excellent moldability and heat resistance. This is investigated below. That is, investigations are carried out below on phenylene ether resin compositions which contain these modified polyphenylene ethers and a heat-curing type curing agent.

Examples 1 to 9, Comparative Examples 1 to 3

The ingredients used when preparing polyphenylene ether resin compositions in these examples are described.
(Polyphenylene Ether)
Modified PPE A to C, PPE E, PPE F: Modified polyphenylene ethers obtained by the synthesis methods described above.
Unmodified PPE: SA90, available from SABIC's Innovative Plastics.
(Heat-Curing Type Curing Agents)
TAIC: Triallyl isocyanurate (Nippon Kasei Chemical Co., Ltd.)
DCP: Dicyclopentadiene-type methacrylate (Shin-Nakamura Chemical Co., Ltd.)
DVB: Divinylbenzene (Tokyo Chemical Industry Co., Ltd.)
N690: Cresol novolak-type epoxy resin (DIC Corporation)
(Initiator)
Initiator: 1,3-Bis(butylperoxyisopropyl)benzene (Perbutyl P, from NOF Corporation)
(Catalyst)
Catalyst: 2-Ethyl-4-methylimidazole (2E4Mz, from Shikoku Chemicals Corporation)
[Method of Preparation]

First, the ingredients other than the initiator were added to toluene in the proportions shown in Table 2 so as to give a solids concentration of 50 mass %, and mixed. The mixture was then heated to 80° C. and stirred for 30 minutes while at 80° C. Next, the stirred mixture was cooled to 40° C., following which the initiator 1,3-bis(butylperoxyisopropyl)benzene (Perbutyl P, from NOF Corporation) was added in the proportions shown in Table 2, thereby giving a varnish-type resin composition (resin varnish). In Comparative Example 3, instead of an initiator, a catalyst was added in the proportion shown in Table 2.

Next, the resulting resin varnish was impregnated into glass cloth (#2116 type, WEA116E, E Glass; available from Nitto Boseki Co., Ltd.), then dried under heating at 130° C. for about 3 to 8 minutes, thereby giving a prepreg. The combined content of the resin components such as the polyphenylene ether and the heat-curing type curing agent (resin content) at this time was adjusted so as to be about 50 mass %.

Next, given numbers of the respective prepregs thus obtained were stacked and laminated, then subjected to applied heat and pressure at a temperature of 200° C. and a pressure of 3 MPa for 2 hours, thereby giving test substrates of predetermined thicknesses.

For example, by stacking and laminating together six prepregs, test substrates having thicknesses of about 0.8 mm were obtained.

Tests were carried out by the following methods on the respective prepregs and test substrates thus produced.

[Dielectric Properties (Dielectric Constant and Loss Tangent)]

The dielectric constants and loss tangents of the test substrates at 10 GHz were measured by the cavity resonator perturbation method. Specifically, the dielectric constants and loss tangents of the test substrates at 10 GHz were measured using a network analyzer (N5230A, from Agilent Technologies).

[Glass Transition Temperature (Tg)]

The Tg of each prepreg was measured using a DMS 100 dynamic mechanical spectrometer from Seiko Instruments. At this time, the frequency in the bending module was set to 10 Hz and dynamic mechanical analysis (DMA) was carried out. The temperature at which tan δ reached a maximum when the temperature was raised at a rate of 5° C./min from room temperature to 280° C. was defined as Tg.

[Moldability 1]

A core material patterned in the form of a grid with linewidths (L) of 1 mm and spaces (S) between the lines of 2 mm (L/S=½ mm) was formed on the resulting test substrate. This core material was black-oxide plated. Next, a prepreg was laminated on top thereof and forming was carried out, thereby fabricating a test substrate having an inner layer in a grid pattern. The presence of voids, such as voids due to poor flow properties by the resin varnish, were confirmed in this fabricated test substrate. Next, this formed product was boiled for 6 hours, then immersed in a 288° C. solder bath. In cases where no voids were observed and neither swelling nor measling could be confirmed after dipping in the solder bath, the moldability was rated as "Good." In cases where the occurrence of either swelling or measling could be confirmed, the moldability was rated as "NG."

[Moldability 2]

A core material pattern in the form of a grid with linewidths (L) of 100 μm and spaces (S) between the lines of 100 μm (L/S=100/100 μm) was formed on the resulting test substrate. This core material was black-oxide plated. Next, a prepreg was laminated on top thereof and secondary forming was carried out, thereby fabricating a test substrate having an inner layer in a grid pattern. This fabricated test substrate was evaluated in the same way as described above under "Moldability 1."

[Stability of Resin Varnish]

The resulting resin varnish was cooled to room temperature, then left to stand for one day, after which the clarity of the resin varnish was visually confirmed. A rating of "Good" was assigned when clarity could be confirmed, and a rating of "NG" was assigned when turbidity could be confirmed.

The results obtained in the above tests are presented in Table 2.

TABLE 2

|  |  | Example 1 | Example 2 | Example 3 | Example 4 | Example 5 | Example 6 | Example 7 | Example 8 | Example 9 | Comp. Ex. 1 | Comp. Ex. 2 | Comp. Ex. 3 |
|---|---|---|---|---|---|---|---|---|---|---|---|---|---|
| Composition (parts by mass) | Modified PPE A | 70 | 70 | — | — | 50 | 30 | 70 | 15 | 95 | — | — | — |
|  | Modified PPE B | — | — | 70 | — | — | — | — | — | — | — | — | — |
|  | Modified PPE C | — | — | — | 70 | — | — | — | — | — | — | — | — |
|  | Modified PPE E | — | — | — | — | — | — | — | — | — | 70 | — | — |
|  | Modified PPE F | — | — | — | — | — | — | — | — | — | — | 70 | — |
|  | Unmodified PPE | — | — | — | — | — | — | — | — | — | — | — | 70 |
|  | TAIC | 30 | — | 30 | 30 | 50 | 70 | — | 85 | 5 | 30 | 30 | — |
|  | DCP | — | 30 | — | — | — | — | — | — | — | — | — | — |
|  | DVB | — | — | — | — | — | — | 30 | — | — | — | — | — |
|  | N690 | — | — | — | — | — | — | — | — | — | — | — | 30 |
|  | Initiator | 1 | 1 | 1 | 1 | 1 | 1 | 1 | 1 | 1 | 1 | 1 | — |
|  | Catalyst | — | — | — | — | — | — | — | — | — | — | — | 0.2 |
| Evaluations | Dielectric constant | 3.5 | 3.5 | 3.6 | 3.6 | 3.5 | 3.6 | 3.5 | 3.7 | 3.4 | 3.5 | 3.6 | 4.0 |
|  | Loss tangent | 0.008 | 0.008 | 0.009 | 0.009 | 0.008 | 0.009 | 0.008 | 0.010 | 0.007 | 0.008 | 0.009 | 0.0013 |
|  | Tg (° C.) | 235 | 225 | 220 | 223 | 235 | 230 | 230 | 220 | 200 | 215 | 195 | 200 |
|  | Moldability 1 | good | good | good | good | good | good | good | good | good | good | good | good |
|  | Moldability 2 | good | good | good | good | good | good | good | good | NG | NG | good | good |
|  | Stability of resin varnish | good | good | good | good | good | good | good | good | good | NG | good | good |

As is apparent from Table 2, those resin compositions which contain a modified polyphenylene ether having an intrinsic viscosity, as measured in 25° C. methylene chloride, of from 0.03 to 0.12 dL/g, having on molecular ends thereof an average of 1.5 to 3 groups represented by formula (1) per molecule, and including not more than 5 mass % of a high-molecular-weight component having a molecular weight of 13,000 or more (Examples 1 to 9) possess, as mentioned above, the excellent dielectric properties of polyphenylene ether, and cured products thereof are endowed with excellent moldability and excellent heat resistance.

Moreover, it was found that cases in which the modified polyphenylene ether content, based on the combined amount of modified polyphenylene ether and heat-curing type curing agent, is from 30 to 90 mass % (Examples 1 to 7), when compared to cases in which the modified polyphenylene ether content is less than 30 mass % (Example 8), are better able to retain the excellent dielectric properties of polyphenylene ether. It was additionally learned that Examples 1 to 7 have better moldability that cases in which the modified polyphenylene ether content is more than 90 mass % (Example 9).

This specification discloses, as described above, the technology according to various aspects of the invention, with the principle technology thereof being summarized below.

The modified polyphenylene ether according to one aspect of the invention is a modified polyphenylene ether having an intrinsic viscosity, as measured in 25° C. methylene chloride, of from 0.03 to 0.12 dL/g, having on molecular ends thereof an average of 1.5 to 3 groups represented by formula (1) above per molecule, and including not more than 5 mass % of a high-molecular-weight component having a molecular weight of 13,000 or more.

In formula (1), $R^1$ is a hydrogen atom or an alkyl group of 1 to 10 carbons, and $R^2$ is an alkylene group of 1 to 10 carbons.

By way of such an arrangement, there can be provided a modified polyphenylene ether which has the outstanding dielectric properties of polyphenylene ether, has an excellent reactivity that contributes to the curing reaction and an excellent storage stability, and also has a low viscosity and excellent flow properties. Moreover, a method of preparing such a modified polyphenylene ether can be provided. By using this modified polyphenylene ether, it is possible to prepare a resin composition which has the excellent dielectric properties of polyphenylene ether and cured products of which have an excellent moldability and heat resistance.

The above modified polyphenylene ether preferably have recurring units of above formula (2) on the molecule.

In above formula (2), $R^3$, $R^4$, $R^5$ and $R^6$ are each independently a hydrogen atom, an alkyl group, an alkenyl group, an alkynyl group, a formyl group, an alkylcarbonyl group, an alkenylcarbonyl group or an alkynylcarbonyl group; and m is from 1 to 50.

By way of such an arrangement, there can be provided a modified polyphenylene ether which has a better reactivity that contributes to the curing reaction and a better storage stability, and which moreover has a low viscosity and better flow properties.

Moreover, in the above modified polyphenylene ether, the group represented by formula (1) is preferably at least one selected from among p-ethenylbenzyl and m-ethenylbenzyl.

By way of such an arrangement, there can be provided a modified polyphenylene ether which has a better reactivity that contributes to the curing reaction and a better storage stability, and which moreover has a low viscosity and better flow properties.

The modified polyphenylene ether preparation method according to another aspect of the invention is a method of preparing the above modified polyphenylene ether which includes the step of reacting a polyphenylene ether having an intrinsic viscosity, as measured in 25° C. methylene chloride, of from 0.03 to 0.12 dL/g, having on molecular ends thereof an average of from 1.5 to 3 phenolic hydroxyl groups per molecule, and including not more than 5 mass % of a high-molecular-weight component having a molecular weight of 13,000 or more with a compound represented by formula (3) above.

In above formula (3), $R^1$ is a hydrogen atom or an alkyl group of 1 to 10 carbons, $R^2$ is an alkylene group of 1 to 10 carbons, and X is a halogen atom.

By way of such an arrangement, a modified polyphenylene ether having the excellent dielectric properties of polyphenylene ether, an excellent reactivity which contributes to the curing reaction and an excellent storage stability, and having a low viscosity and excellent flow properties can be prepared.

In the above method of preparing a modified polyphenylene ether, the reaction is preferably carried out in the presence of an alkali metal hydroxide.

By way of such an arrangement, a modified polyphenylene ether having the excellent dielectric properties of polyphenylene ether, an excellent reactivity which contributes to the curing reaction and an excellent storage stability, and having a low viscosity and excellent flow properties can be more easily prepared.

Also, in the above method of preparing a modified polyphenylene ether, the reaction is preferably carried out in the presence of a phase transfer catalyst.

By way of such an arrangement, a modified polyphenylene ether having the excellent dielectric properties of polyphenylene ether, an excellent reactivity which contributes to the curing reaction and an excellent storage stability, and having a low viscosity and excellent flow properties can be more easily prepared.

Also, in the above method of preparing a modified polyphenylene ether, the compound represented by formula (3) is preferably at least one selected from the group consisting of p-chloromethylstyrene and m-chloromethylstyrene.

By way of such an arrangement, a modified polyphenylene ether having the excellent dielectric properties of polyphenylene ether, an excellent reactivity which contributes to the curing reaction and an excellent storage stability, and having a low viscosity and excellent flow properties can be more easily prepared.

Moreover, in the above method of preparing a modified polyphenylene ether, the reaction is preferably carried out in the presence of toluene.

By way of such an arrangement, a modified polyphenylene ether having the excellent dielectric properties of polyphenylene ether, an excellent reactivity which contributes to the curing reaction and an excellent storage stability, and having a low viscosity and excellent flow properties can be more easily prepared.

The polyphenylene ether resin composition according to yet another aspect of the invention is a polyphenylene ether resin composition which includes the above modified polyphenylene ether or a modified polyphenylene ether obtained by the above modified polyphenylene ether preparation method, and includes also a heat-curing type curing agent.

By way of such an arrangement, there can be provided a polyphenylene ether resin composition which retains the excellent dielectric properties of polyphenylene ethers and cured products of which have an excellent moldability and heat resistance.

In this polyphenylene ether resin composition, the heat-curing type curing agent is preferably at least one selected from the group consisting of trialkenyl isocyanurate compounds, polyfunctional acrylate compounds having at least two acryl groups on the molecule, polyfunctional methacrylate compounds having at least two methacryl groups on the molecule and polyfunctional vinyl compounds having at least two vinyl groups on the molecule.

By way of such an arrangement, there can be provided a polyphenylene ether resin composition which retains the excellent dielectric properties of polyphenylene ethers and cured products of which have an excellent moldability and heat resistance.

Also, in this polyphenylene ether resin composition, the content of the modified polyphenylene ether, based on the combined amount of the modified polyphenylene ether and the heat-curing type curing agent, is preferably from 30 to 95 mass %.

By way of such an arrangement, there can be provided a polyphenylene ether resin composition which retains the excellent dielectric properties of polyphenylene ethers and cured products of which have an excellent moldability and heat resistance.

The resin varnish according to still another aspect of the invention includes the above polyphenylene ether resin composition and a solvent.

By way of such an arrangement, there can be obtained a resin varnish having excellent dielectric properties moldability and heat resistance.

In this resin varnish, the solvent is preferably toluene.

By way of such an arrangement, there can be obtained a resin varnish having an even better moldability in cured products thereof.

The prepreg according to a further aspect of the invention is a prepreg obtained by impregnating the above polyphenylene ether resin composition into a fibrous base material.

By way of such an arrangement, a prepreg having excellent dielectric properties, moldability and heat resistance can be obtained. Moreover, by using this prepreg, a metal-clad substrate or a printed circuit board having excellent dielectric properties, moldability and heat resistance can be obtained.

The metal-clad laminate according to another aspect of the invention is a metal-clad laminate obtained by laminating metal foil on this prepreg, and molding under applied heat and pressure.

By way of such an arrangement, a metal-clad laminate having excellent dielectric properties, moldability and heat resistance can be obtained.

The printed circuit board according to yet another aspect of the invention is a printed circuit board manufactured using this prepreg.

By way of such an arrangement, a printed circuit board having excellent dielectric properties, moldability and heat resistance can be obtained.

INDUSTRIAL APPLICABILITY

The invention provides a modified polyphenylene ether which has the excellent dielectric properties of polyphenylene ether, has an excellent reactivity that contributes to the curing reaction and an excellent storage stability, and moreover has a low viscosity and excellent flow properties. Also provided is a method of preparing such a modified polyphenylene ether. The invention further provides a polyphenylene ether resin composition which, by using such a modified polyphenylene, has the excellent dielectric properties of polyphenylene ether and cured products of which have an excellent moldability and heat resistance. The invention additionally provides a prepreg which uses such a polyphenylene ether resin composition, a metal-clad substrate which uses such a prepreg, and a printed circuit board fabricated using such a prepreg.

The invention claimed is:

1. A modified polyphenylene ether having groups represented by formula (1) below on molecular ends of a polyphenylene ether represented by formula (4) below, having an intrinsic viscosity, as measured in 25° C. methylene chloride, of from 0.03 to 0.12 dL/g, having on molecular ends thereof an average of 1.5 to 3 groups represented by formula (1) below per molecule, and including not more than 5 mass % of a high-molecular-weight component having a molecular weight of 13,000 or more:

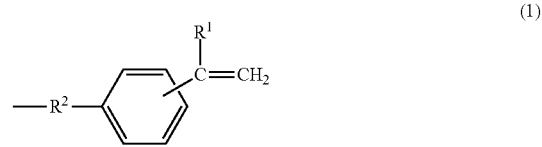

where $R^1$ is a hydrogen atom or an alkyl group of 1 to 10 carbons, and $R^2$ is an alkylene group of 1 to 10 carbons, and

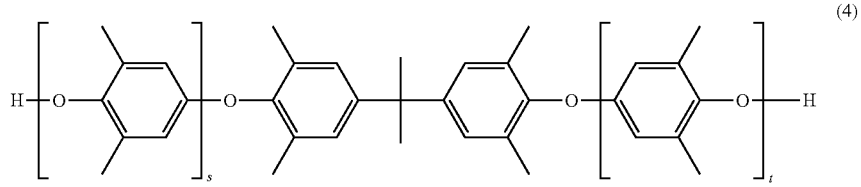

where s is from 1 to 20, t is from 1 to 20, and the combined value of s and t is from 1 to 30.

2. The modified polyphenylene ether according to claim 1, wherein the group represented by formula (1) is at least one selected from the group consisting of p-ethenylbenzyl and m-ethenylbenzyl.

3. A polyphenylene ether resin composition comprising:
the modified polyphenylene ether according to claim 2; and
a heat-curing type curing agent.

4. The polyphenylene ether resin composition according to claim 3, wherein the heat-curing type curing agent is at least one selected from the group consisting of trialkenyl isocyanurate compounds, polyfunctional acrylate compounds having at least two acryl groups on the molecule, polyfunctional methacrylate compounds having at least two methacryl groups on the molecule and polyfunctional vinyl compounds having at least two vinyl groups on the molecule.

5. The polyphenylene ether resin composition according to claim 3, wherein the content of the modified polyphenylene ether, based on a total combined amount of the modified polyphenylene ether and the heat-curing type curing agent, is from 30 to 95 mass %.

6. A resin varnish comprising the polyphenylene ether resin composition according to claim 3, and a solvent.

7. The resin varnish according to claim 6, wherein the solvent is toluene.

8. A prepreg obtained by impregnating the polyphenylene ether resin composition according to claim 3 into a fibrous base material.

9. A metal-clad laminate obtained by laminating metal foil on the prepreg according to claim 8, and molding under applied heat and pressure.

10. A printed circuit board manufactured using the prepreg according to claim 8.

11. A method of preparing the modified polyphenylene ether according to claim 1, comprising reacting a polyphenylene ether represented by formula (4) below and having an intrinsic viscosity, as measured in 25° C. methylene chloride, of from 0.03 to 0.12 dL/g, having on molecular ends thereof an average of from 1.5 to 3 phenolic hydroxyl groups per molecule, and including not more than 5 mass % of a high-molecular-weight component having a molecular weight of 13,000 or more with a compound represented by formula (3) below:

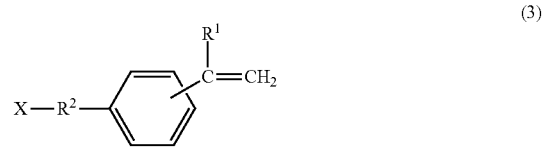

where $R^1$ is a hydrogen atom or an alkyl group of 1 to 10 carbons, $R^2$ is an alkylene group of 1 to 10 carbons, and X is a halogen atom, and

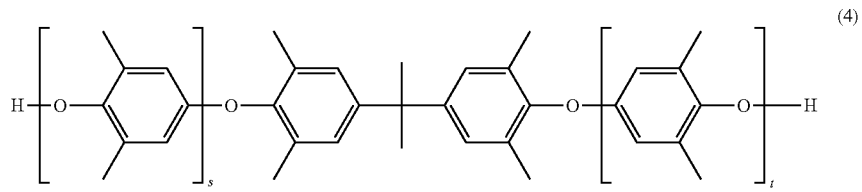

where s is from 1 to 20, t is from 1 to 20, and the combined value of s and t is from 1 to 30.

12. The modified polyphenylene ether preparation method according to claim 11, wherein the reaction is carried out in the presence of an alkali metal hydroxide.

13. The modified polyphenylene ether preparation method according to claim 12, wherein the reaction is carried out in the presence of a phase transfer catalyst.

14. The modified polyphenylene ether preparation method according to claim 11, wherein the compound represented by formula (3) is at least one selected from the group consisting of p-chloromethylstyrene and m-chloromethylstyrene.

15. The modified polyphenylene ether preparation method according to claim 11, wherein the reaction is carried out in the presence of toluene.

* * * * *